United States Patent [19]

Usuki et al.

[11] Patent Number: 5,130,261

[45] Date of Patent: Jul. 14, 1992

[54] METHOD OF RENDERING THE IMPURITY CONCENTRATION OF A SEMICONDUCTOR WAFER UNIFORM

[75] Inventors: Yoshikazu Usuki, Himeji; Shigeo Yawata, Hyogo; Jun-ichi Okano, Hyogo; Shigeru Moriyama, Himeji; Shun-ichi Hiraki, Nagareyama, all of Japan

[73] Assignee: Kabushiki Kaisha Toshiba, Kawasaki, Japan

[21] Appl. No.: 578,603

[22] Filed: Sep. 7, 1990

[30] Foreign Application Priority Data

Sep. 11, 1989 [JP] Japan .................. 1-235239

[51] Int. Cl.⁵ ........................................... H01L 21/265
[52] U.S. Cl. ..................................... 437/20; 437/946; 437/161; 148/DIG. 174; 148/DIG. 15
[58] Field of Search ............ 437/20, 16, 21, 939, 437/946; 148/DIG. 176, DIG. 41; 357/13; 156/603

[56] References Cited

U.S. PATENT DOCUMENTS

| | | | |
|---|---|---|---|
| 3,345,221 | 10/1967 | Lesk | 357/13 |
| 3,484,308 | 12/1969 | Lesk | 357/13 |
| 3,510,368 | 8/1966 | Hahn | 357/13 |
| 3,798,081 | 3/1974 | Beyer | 148/188 |
| 3,808,060 | 4/1974 | Hays et al. | 148/187 |
| 3,909,304 | 9/1975 | Cho | 148/1.5 |
| 3,978,517 | 8/1976 | Brown et al. | 357/13 |
| 4,155,777 | 5/1979 | Dunkley et al. | 437/30 |
| 4,266,985 | 5/1981 | Ito et al. | 148/1.5 |
| 4,349,394 | 9/1982 | Wei | 437/946 |
| 4,463,492 | 8/1984 | Maeguchi | 29/576 B |
| 4,775,643 | 10/1988 | Wetteroth | 437/601 |

FOREIGN PATENT DOCUMENTS

| | | | |
|---|---|---|---|
| 0017719 | 2/1980 | European Pat. Off. | |
| 1959817 | 6/1971 | Fed. Rep. of Germany | 357/13 |
| 0016376 | 5/1980 | Japan | 357/13 |
| 0080126 | 7/1981 | Japan | 437/21 |
| 0084422 | 5/1984 | Japan | 437/24 |
| 0051646 | 3/1988 | Japan | 437/939 |

OTHER PUBLICATIONS

Ghandhi, "VLSI fabrication principles", John Wiley & Sons Inc., 1983, p. 357.
Beyer et al., 1046 Journal of the Electrochemical Society, vol. 129, No. 11, pp. 2527–2530 (1982).

Primary Examiner—Olik Chaudhuri
Assistant Examiner—Ourmazd S. Ojan
Attorney, Agent, or Firm—Finnegan, Henderson, Farabow, Garrett and Dunner

[57] ABSTRACT

According to this invention, there is provided to a method of manufacturing semiconductor devices including the steps of ion-implanting at least one impurity selected from As, P, Sb, Si, B, Ga, and Al in a wafer prior to a predetermined manufactural process of semiconductor devices in the semiconductor wafer grown by the Czochralski technique, and thereafter annealing the wafer at a temperature of at least 900° C. Nonuniformity of an impurity concentration of the wafer can be improved. The difference in characteristics among the semiconductor devices manufactured in the wafer is decreased, a product yield can be increased, and the quality of the semiconductor devices can be improved.

10 Claims, 2 Drawing Sheets

METHOD OF RENDERING THE IMPURITY CONCENTRATION OF A SEMICONDUCTOR WAFER UNIFORM

BACKGROUND OF THE INVENTION

1. Field of the Invention

The present invention relates to a method of manufacturing a semiconductor device and, more particularly, to a method of manufacturing a semiconductor device using a semiconductor wafer grown by a CZ (Czochralski) technique and, especially, a high-impurity concentration semiconductor substrate (wafer).

2. Description of the Related Art

A semiconductor wafer grown by a CZ technique is obtained by cutting a single crystal ingot and polishing it to be a mirror surface. A semiconductor device is often manufactured by applying a predetermined formation process to the semiconductor substrate in this state. According to degree of characteristics required for the device, a semiconductor device may be manufactured using a substrate obtained by stacking epitaxially grown layers.

Ununiformity of an impurity concentration of a semiconductor wafer grown by the CZ technique largely depends on a pulling condition of a single crystal such as nonuniformity of a temperature at the growth interface. For this reason, in order to obtain a uniform concentration, various pulling methods were proposed and performed. However, a single crystal having a completely uniform impurity concentration cannot be obtained as a matter of fact.

When pulling methods are changed to improve uniformity, the resultant substrate becomes expensive. Therefore, this substrate is effective for a semiconductor device having high value added. However, in an inexpensive semiconductor device, a semiconductor substrate having a nonuniform impurity concentration is still used in consideration of profitability.

Especially, in a high-impurity concentration semiconductor wafer, an impurity concentration during pull of a single crystal is difficult to be uniformed, and there is no effective evaluation method. Therefore, a satisfactory method of uniforming an impurity concentration is not obtained at present. For this reason, as a method of uniforming an impurity concentration, a substrate on which an epitaxially grown layer is stacked may be used depending on characteristic ranks. However, in some rank which cannot employ this substrate, a substrate having a nonuniform impurity concentration is used, thereby manufacturing a semiconductor device.

When the impurity concentration in a substrate (wafer) is nonuniformed, variations in characteristics of elements formed in the substrate are increased, thereby causing a lower yield.

This problem will be further described below using a method of forming Zener diodes as an example. In a conventional method, a wafer grown by the CZ technique (such as an As-doped wafer having a resistivity of 4 mΩ.cm or less) is directly used. Oxidation, PEP (photoetching method), CVD (chemical vapor deposition), and diffusion are performed for the wafer to form electrodes, thereby forming a large number of Zener diodes (the size of each chip is about 0.3 ×0.3 mm$^2$) in the wafer. In this state, a Zener voltage characteristic of each element is measured to discriminate a non-defective element from a defective element, and color marks are formed on the defective elements to identify them. Then, concentric striae, each formed of defective elements can be observed on the wafer. This is caused by a nonuniform impurity concentration of the semiconductor wafer prior to a predetermined process, since the difference in characteristic among semiconductor elements during the manufactural process is reduced. In the case where it is intended to grow silicon ingots with a high impurity concentration by means of the CZ technique, it may be very difficult to uniform the impurity concentration between the solid phase and the liquid phase. In particular, when an impurity concentration of a melt approaches its solid solution limit, it becomes more difficult to uniform this impurity concentration. Therefore, the silicon ingots may have a distribution of nonuniform impurity concentration. When a wafer formed from such an ingot is employed, the obtained semiconductor elements will have different characteristics, as has been described above. The nonuniformity of the impurity concentration occurs when the single crystal is pulled, as described above. FIG. 3 shows a characteristic distribution of Zener diodes arranged along the diameter of the wafer. The abscissa indicates that position of the wafer which extends along a diameter thereof, and the ordinate indicates a Zener voltage. A curve in FIG. 3 illustrates a relationship between the position of any chip formed in that portion of the wafer which extends the diameter thereof, and the Zener voltage VZ of that chip, and the relationship is illustrated by a continuous curve as a matter of convenience. Thin lines $V_1$ and $V_2$ parallel to the abscissa indicate upper and lower limit values of the rated Zener voltage standards of the element. As is apparent from FIG. 3, when a wafer formed by a CZ technique is directly used, the difference in characteristics among the elements, even in a single wafer, is large, and a yield of the elements is low.

As a method of doping an impurity in a semiconductor wafer, there is diffusion, POCl$_3$ deposition, a CVD method, or the like. Although any one method is selected from these methods, the semiconductor elements formed in the wafer have greatly different characteristics. Therefore, the methods are not suitable for obtaining desired uniformity of the impurity concentration.

As described above, if a predetermined manufactural process is performed to form semiconductor devices on a semiconductor wafer grown by only a CZ technique, the difference in characteristics of the formed elements are increased, and a yield of the elements is decreased due to the nonuniformity of an impurity concentration in the wafer.

SUMMARY OF THE INVENTION

It is therefore an object of the present invention to provide an improved method of manufacturing a semiconductor device using a semiconductor wafer grown by a CZ technique so as to improving nonuniformity of an impurity concentration of the wafer produced during a single crystal pulling, whereby decreasing the difference in characteristics of elements formed in the wafer, increasing the yield, and improving quality of the elements.

It is another object of the present invention to provide an improved method of manufacturing a Zener diode, upon use of a semiconductor wafer grown by a CZ technique, capable of improving nonuniformity of an impurity concentration of the wafer produced during a single crystal pulling, whereby decreasing the difference in characteristics of elements formed in the wafer, increasing the yield, and improving quality of the elements.

The above objects are achieved by the following method.

That is, a method of manufacturing semiconductor devices comprises the steps of ion-implanting at least one impurity selected from the group consisting of As, P, Sb, Si, B, Ga, and Al in the substrate prior to a predetermined manufactural process of semiconductor devices in the semiconductor wafer grown by a Czochralski technique, and thereafter annealing the wafer at a temperature of not less than 900° C.

According to another aspect of the present invention, the following method of manufacturing Zener diodes is applied.

There is provided to an improved method of manufacturing Zener diodes, comprising the steps of ionimplanting at least one impurity selected from the group consisting of As, P, Sb, Si, B, Ga, and Al in a substrate prior to a predetermined manufactural process of semiconductor devices in the semiconductor wafer grown by a Czochralski technique, depositing a film by a chemical vapor deposition method, annealing the wafer at a temperature of not less than 900° C. to recover crystallinity for an amorphous portion in which the impurity ions are implanted, removing the film, forming an oxide film on an entire surface of the wafer, forming an opening in the oxide film by photoetching, forming a boron doped oxide film by a chemical vapor deposition method, thereafter, heating the wafer to diffuse the boron to form a p-type region, and forming an electrode which is in ohmic-contact with the p-type region.

According to the above method, using the semiconductor wafer grown by the CZ technique, nonuniformity of the impurity concentration of the wafer produced during the single crystal pulling is largely improved. However, the mechanism for this is not clarified yet. It is assumed that nonuniformity of impurity concentration which is present in the semiconductor wafer grown by the CZ technique and which appears as concentric striae is reduced in a process in which an amorphous layer produced by implantation of high-concentration ions is recrystallized by the annealing treatment. However, the mechanism in the present invention is not limited to the above interpretation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENT

An embodiment of the present invention will be described below concerning a method of manufacturing Zener diodes with reference to the accompanying drawings.

Figure 1A:
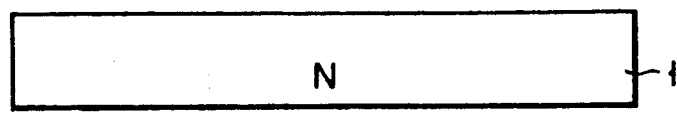
FIGS. 1A to 1D are sectional views showing a device in each step for explaining a method of making a semiconductor wafer of the present invention.
Figure 1B:
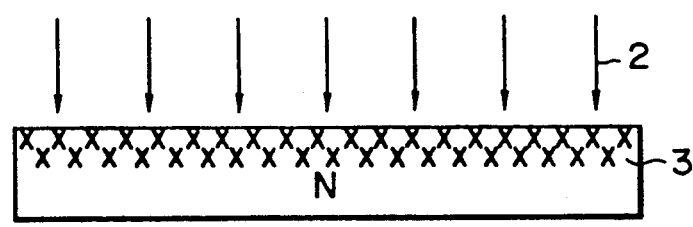
Figure 1C:
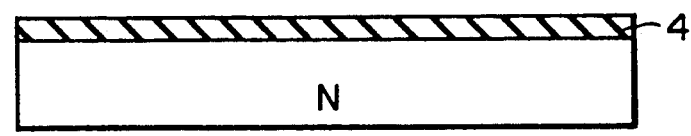
Figure 1D:
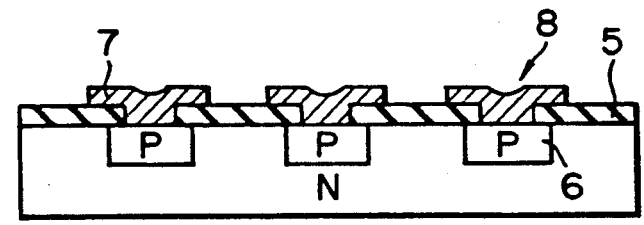

A semiconductor wafer (substrate) 1 shown in FIG. 1A is obtained by cutting a single crystal ingot grown by a CZ technique into a wafer shape and by repeating mechanical and chemical polishing treatments to provide a mirror surface. This wafer is in a state before a predetermined manufacture process of Zener diodes is applied, and the wafer is doped with As having a resistivity of 4 mΩ·cm or less. As shown in FIG. 1B, phosphorus (P) ions 2 are implanted in the wafer 1 by an ion-implantation method at an acceleration voltage of 60 keV and a dose of $1 \times 10^{16}$ ions/cm$^2$. Note that the mark x denotes an amorphous layer 3 produced by the ion-implantation method. As shown in FIG. 1C, after a film 4 made of a material such as UDO (undoped oxide) or PSG (phosphosilicate glass) is deposited by CVD (chemical vapor deposition), an annealing treatment is applied to the resultant structure at a temperature of 1,100° C. for 30 minutes to recover crystallinity for the amorphous layer 3. Thereafter, the film 4 such as the UDO or the PSG is removed. As shown in FIG. 1D, conventional manufacture of Zener diodes is applied to the semiconductor wafer. That is, an oxide film 5 is formed on the entire surface of the wafer, and openings is formed in the oxide film by a PEP (photoetching) method. After an oxide film in which boron are doped by the CVD method is formed, the boron are diffused by annealing this to manufacture p-type regions 6 of the Zener diodes, and electrodes 7 which are in ohmic-contact with the p-type regions 6 are manufacture. Thus, Zener diodes 8 can be obtained.

Figure 3:
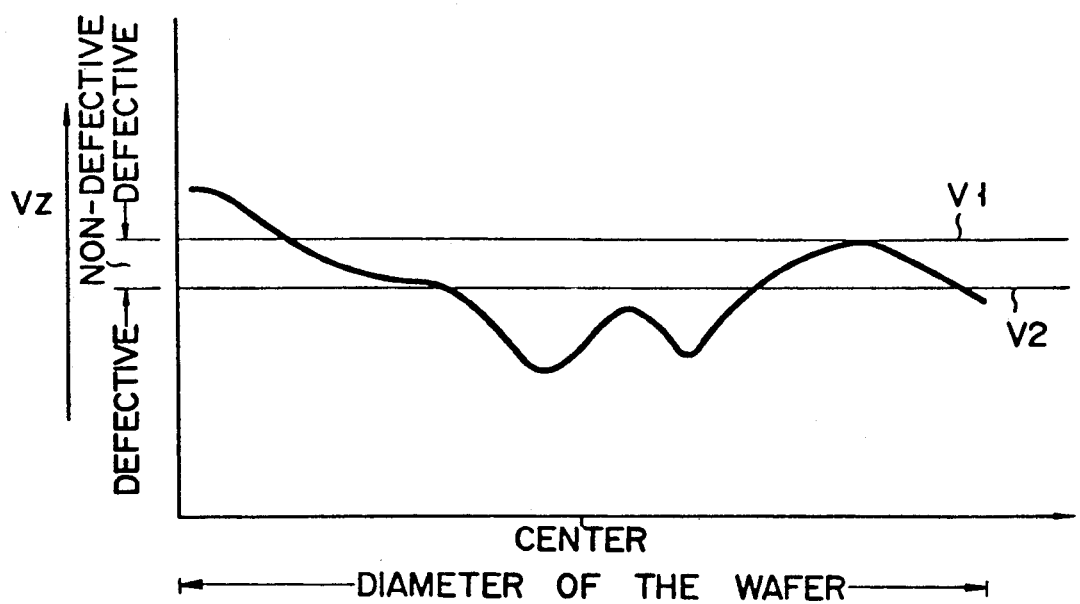
FIG. 3 is a graph showing a characteristic distribution of the devices along a diameter of the wafer made by a conventional method.

In a plurality of Zener diodes (the size of each chip is about $0.3 \times 0.3$ m$^{-2}$) manufactured in the wafer by the making method of the above embodiment, Zener voltage characteristics of the diodes are measured to discriminate non-defective diodes from defective diodes. In the wafer according to the present invention, no concentric striae each formed of defective semiconductor elements are observed. In a semiconductor device actually manufactured on an experimental basis, the distribution of the characteristics of the Zener diodes arranged along the diameter of the wafer did not appear as concentric striae, and most of them had characteristics falling within the "non-defective" region shown in FIG. 3.

Figure 2A:
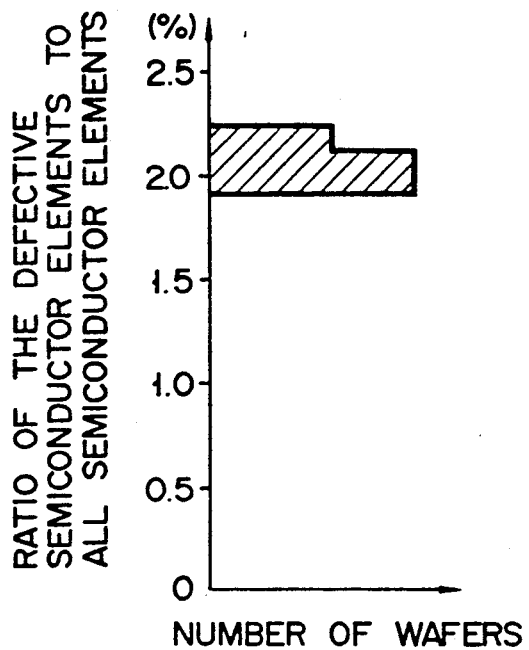
FIG. 2A is a graph showing the ratio of the defective semiconductor elements to all semiconductor elements formed in the wafer made by the conventional method.
Figure 2B:
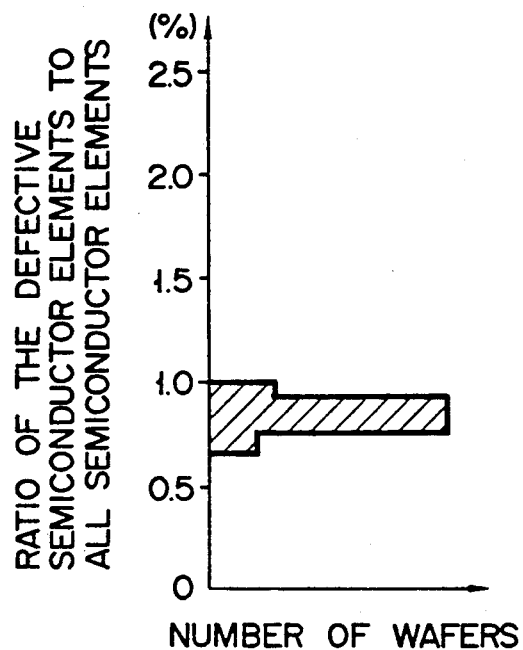
FIG. 2B is a graph representing the ratio of the defective semiconductor elements to all semiconductor elements formed in the wafer made by the method according to the present invention.

FIG. 2A shows the relationship between the number of wafers made by the conventional method and the ratio (%) of the defective semiconductor elements to all semiconductor elements manufactured in these wafers. FIG. 2B represents the relationship between the number of wafers made by the method of the present invention and the ratio (%) of defective semiconductor elements to all semiconductor elements manufactured in these wafers. In either figure, the number of wafers is plotted on the x axis, while the ratio of defective semiconductor elements is plotted on the y axis. As is evident from FIG. 2A, 2% or more of the semiconductor elements manufactured in the wafers prepared by the conventional method was defective. By contrast, as can be seen from FIG. 2B, only 1% or less of the semiconductor elements manufactured in the wafers made by the method of this invention were defective. In other words, the ratio of defective semiconductor elements in the method according to this invention is about half that in the conventional method.

From this result, it will be apparent that nonuniformity of an impurity concentration of a semiconductor substrate formed by a CZ method can be greatly improved, using the present invention.

Conditions of the ion-implantation or the annealing treatment in the above embodiment are changed in accordance with a substrate concentration, a type of ions, a characteristic rank of an element, and the like.

In the above embodiment, phosphorus ions are used as the implanted ions, but ions of at least one element selected from As, P, Sb, Si, B, Ga, and Al may be used. For example, when ions of P and Si are used, the same advantages as described above can be obtained. The temperature of an annealing treatment performed after ion implantation may be equal to a temperature of a conventional annealing treatment performed after ion implantation. If the annealing temperature is less than 900° C., however, satisfactory advantages may not be obtained.

The above embodiment is applied to Zener diodes. However, the present invention can be effectively applicable to other semiconductor devices and especially to semiconductor devices using a wafer having a high impurity concentration, which is difficult to obtain the uniform impurity concentration.

Additional advantages and modifications will readily occur to those skilled in the art. Therefore, the invention in its broader aspects is not limited to the specific details, and illustrated examples shown and described. Accordingly, various modifications may be made without departing from the spirit or scope of the general inventive concept as defined by the appended claims and their equivalents.

What is claimed is:

1. A method of rendering the impurity concentration of a semiconductor wafer uniform, comprising the steps of:

forming a wafer having a resistivity of 4 mΩ/cm or less by cutting a single crystal ingot doped with As and formed by a Czochralski technique;

directly injecting impurity ions into substantially an entire main surface of said wafer to a concentration lower than the original impurity concentration of said wafer, thereby forming an amorphous layer in upper surface regions of said wafer;

depositing a film on said main surface of said wafer by a chemical vapor deposition method;

annealing said wafer at a temperature of at least 900° C., thereby recovering crystallinity of said amorphous layer; and removing the film.

2. A method according to claim 1, wherein said impurity ions are selected from As, P, Sb, Si, B, Ga, and Al.

3. A method according to claim 1, wherein said impurity ions comprise phosphorus.

4. A method according to claim 1, wherein said impurity ions comprise phosphorus and silicon.

5. A method according to claim 1, wherein the film is an undoped oxide film.

6. A method according to claim 1, wherein the film is made of phosphosilicate glass.

7. A method of rendering the impurity concentration of a semiconductor wafer uniform, comprising the steps of:

forming a wafer of a first conductivity type and having a resistivity of 4 mω/cm or less by cutting a single crystal ingot doped with As and formed by a Czochralski technique;

injecting impurity ions into substantially an entire main surface of said wafer to a concentration lower than the original impurity concentration of said wafer, thereby forming an amorphous layer in an upper surface region of said wafer;

depositing a film on said main surface of said wafer by a chemical vapor deposition method;

annealing said wafer at a temperature of at least 900° C., thereby recovering crystallinity of said amorphous layer;

removing the film;

forming a first oxide film on said main surface of said wafer;

forming openings in said first oxide film by photo-etching;

forming by a chemical vapor deposition method a second oxide film doped with impurity ions of a second conductivity type;

heating said wafer to diffuse said impurity ions of the second conductivity type contained in said second oxide film to form a second conductivity type region in said wafer; and forming an electrode in ohmic-contact with said second conductivity type region.

8. A method according to claim 7 wherein said impurity ions are selected from As, P, Sb, Si, B, Ga, and Al.

9. A method according to claim 7, wherein the film is an undoped oxide film.

10. A method according to claim 7, wherein the film is made of phosphosilicate glass.

* * * * *